United States Patent
Kramer et al.

(10) Patent No.: US 6,300,670 B1
(45) Date of Patent: Oct. 9, 2001

(54) BACKSIDE BUS VIAS

(75) Inventors: Alan H. Kramer, Berkeley, CA (US); Danielle A. Thomas, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/360,836

(22) Filed: Jul. 26, 1999

(51) Int. Cl.[7] ................................................... H01L 29/40
(52) U.S. Cl. ..................... 257/621; 257/698; 257/774; 257/772; 257/773; 257/780; 257/777; 257/779; 257/680
(58) Field of Search .................................. 257/621, 698, 257/774, 772, 773, 780, 777, 779, 680

(56) References Cited

U.S. PATENT DOCUMENTS

| | | | |
|---|---|---|---|
| 3,648,131 | 3/1972 | Stuby | 317/235 |
| 3,761,782 | 9/1973 | Youmans | 29/589 |
| 4,426,769 | 1/1984 | Grabbe | 257/704 |
| 5,122,856 | * 6/1992 | Komiya | 357/55 |
| 5,869,889 | 2/1999 | Chia et al. | 257/701 |
| 5,910,687 | 6/1999 | Chen et al. | 257/784 |
| 6,075,712 | 6/2000 | McMahon | 361/783 |
| 6,124,634 | 9/2000 | Akram et al. | 257/698 |

FOREIGN PATENT DOCUMENTS

| | | | |
|---|---|---|---|
| 0 316 799 A1 | 11/1988 | (EP) | H01L/23/52 |
| 22 150 749 A | 7/1985 | (GB) | H01L/23/50 |
| WO 98/27588 | 6/1998 | (WO) | H01L/23/485 |

OTHER PUBLICATIONS

Carsten Christensen, Peter Kersten, Sascha Henke, and Siebe Bouwstra, *Wafer Through–Hole Interconnections with High Vertical Wiring Densities*, Dec. 1996, IEEE transactions on Components, Packaging, and Manufacturing Technology—Part A, vol. 19,No. 4, pp. 516–521.

David Francis and Linda jardine, "A Visible Way to Use Chip–Scale for Discrete Devices", Chip Scale Review, Mar./Apr. 1999, pp. 58–59.

* cited by examiner

*Primary Examiner*—Minh Loan Tran
*Assistant Examiner*—Luan Thai
(74) *Attorney, Agent, or Firm*—Theodore E. Galanthay; Lisa K. Jorgenson; Daniel E. Venglarik (57) ABSTRACT

Metal taps for bus conductors are formed within an active layer, within one or more of the metallization levels, on the active side of a substrate in the area of a bus via. Alignment marks are formed in the same metallization level, in the same area. A slot is then blind etched from the backside of the substrate, exposing the metal taps and the alignment marks. The slot is etched, using an oxide or nitride hard mask, into the backside surface of the substrate with significantly sloped sidewalls, allowing metal to be deposited and patterned on the backside. An insulating layer and deposited metal on the backside surface of the substrate may require a blind etch to expose alignment marks, if any, but front-to-back alignment precision utilizing the exposed alignment marks may permit much smaller design rules for both the metal tabs and the backside interconnects formed from the metal layer. Backside contact pads may also be formed from the metal layer. The backside bus via slot may be etched in the body of a die, near a central region, or along the die boundary to form a shared backside bus via in which metal tabs on opposite sides of the slot connect to backside contacts on different dice after separation of the dice along the boundary. The backside bus is beneficial for sensor devices, leaving more room for sensor circuitry on the active side and simplifying packaging, for pad-limited designs, and for forming stackable integrated circuits.

20 Claims, 9 Drawing Sheets

BACKSIDE BUS VIAS

RELATED APPLICATIONS

The present invention is related to the subject matter of commonly assigned, copending U.S. patent applications Ser. No. 09/360,802 entitled "BACKSIDE CONTACT FOR TOUCHCHIP" and filed Jul. 26,1999. The content of the above-referenced application is incorporated herein by reference.

BACKGROUND OF THE INVENTION

1. Field of the Invention

The present invention relates generally to off-chip buses for integrated circuits, and more specifically to forming a bus via in an integrated circuit for connecting bus conductors to off-chip contact pads on the backside of the die containing the integrated circuit.

2. Description of the Prior Art

A backside bus is a bus within an integrated circuit having conductors connected to contact pads on the backside, or the side opposite that on which active devices are formed, of a substrate. There are a variety of circumstances under which a backside bus is useful in integrated circuitry. Sensor devices, whether for image detection, state switches, or chemical sensors, can particularly benefit from backside buses, which increase the front side surface area of a die available for sensors rather than for contact pads. Pad limited designs, in which the integrated circuit is restricted by the number of contact pads which may be fit along the periphery of a given die, may also benefit significantly from backside buses.

Backside buses may be fabricated by forming through-holes within a substrate for a conductive via connecting a contact on the active side of the substrate with a contact on the backside of the via. A separate through-hole is thus required for each bus conductor, such that the substrate area required for conductor is substantial. Additionally, the challenges of filling a through-hole or otherwise reliably establishing an electrical connection from one end of the through-hole to the other are significant.

It would be desirable, therefore, to provide a technique for implementing backside buses in an integrated circuit with minimal use of substrate area and reliable formation of electrical connections between the active devices on the active side and the contact pads on the backside.

SUMMARY OF THE INVENTION

Metal taps for bus conductors are formed within an active layer, within one or more of the metallization levels, on the active side of a substrate in the area of a bus via. Alignment marks are formed in the same metallization level, in the same area. A slot is then blind etched from the backside of the substrate, exposing the metal taps and the alignment marks. The slot is etched, using an oxide or nitride hard mask, into the backside surface of the substrate with significantly sloped sidewalls, allowing metal to be deposited and patterned on the backside. An insulating layer and deposited metal on the backside surface of the substrate may require a blind etch to expose alignment marks, if any, but front-to-back alignment precision utilizing the exposed alignment marks may permit much smaller design rules for both the metal tabs and the backside interconnects formed from the metal layer. Backside contact pads may also be formed from the metal layer. The backside bus via slot may be etched in the body of a die, near a central region, or along the die boundary to form a shared backside bus via in which metal tabs on opposite sides of the slot connect to backside contacts on different dice after separation of the dice along the boundary. The backside bus is beneficial for sensor devices, leaving more room for sensor circuitry on the active side and simplifying packaging, for pad-limited designs, and for forming stackable integrated circuits.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The following description details the structure, application and features of the present invention, but it will be understood by those of skill in the art that the scope of the invention is defined only by the issued claims, and not by any description herein. The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1A:
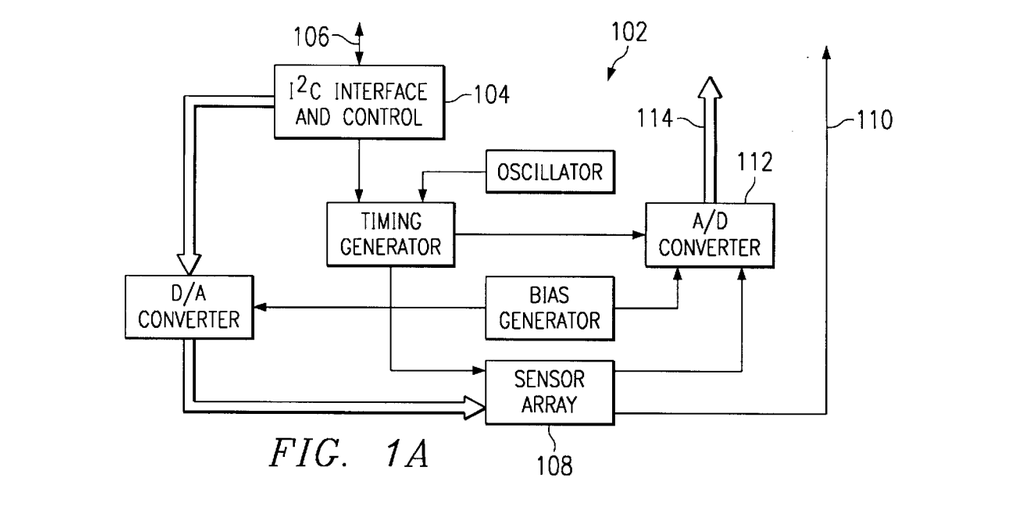
FIGS. 1A–1H depict various views of a sensor circuit employing backside bus vias in accordance with a preferred embodiment of the present invention.

With reference now to the figures, and in particular with reference to FIGS. 1A through 1H, various views of a sensor circuit employing backside bus vias in accordance with a preferred embodiment of the present invention are depicted. FIG. 1A depicts a block diagram of the sensor circuit 102, which is formed as an integrated circuit on a single die. The sensor circuit 102 and its operation are described more fully in commonly assigned, copending application Ser. No. 09/040,261, entitled "CAPACITIVE DISTANCE SENSOR" and filed May 9, 1998, which is incorporated herein by reference.

The portions of sensor circuit 102 relevant to the present invention include $I^2C$ interface and control device 104, which provides a bidirectional communication protocol enabling sensor circuit 102 to communicate with a controller, such as a microcontroller. $I^2C$ interface and control device 104 exchanges digital signals via control line 106 with controller circuitry (not shown) external to sensor circuit 102. Sensor circuit 102 also includes an array 108 of capacitive sensors for fingerprint acquisition by sensing distances between capacitive electrodes within the sensor array 108 and ridges and grooves on a finger placed in contact with sensor array 108. Sensor array 108 is coupled to the external controller circuit via synchronization line 110. Through synchronization line 110 sensor array 108 provides synchronization signals allowing detected voltages representative of the capacitive value of individual capacitive electrodes within sensor array 108, and therefore representative of the distance between the capacitive electrode and the portion of the epidermal layer contacting sensor array 108 in the region of the capacitive electrode, to be properly interpreted by the external controller. Sensor circuit 102 also includes an analog-to-digital (A/D) converter 112 processing analog voltage measurements received from sensor array 108 and generating digital representations recognized by the external controller as distance measurements of the analog measured voltages from individual capacitive electrodes within sensor array 108. A/D converter 112 transmits these digital signals to the external controller on output bus 114.

Control line 106, synchronization line 110, and output bus 114 each require electrical connection to signal lines external to the die on which sensor circuit 102 is formed. A "bus" may be employed for each conductive line included within control line 106 and synchronization line 110, and output bus 114 is a bus. A backside bus via in accordance with the present invention may be employed for any or all of these signal lines, as described in further detail below.

Figure 1B:
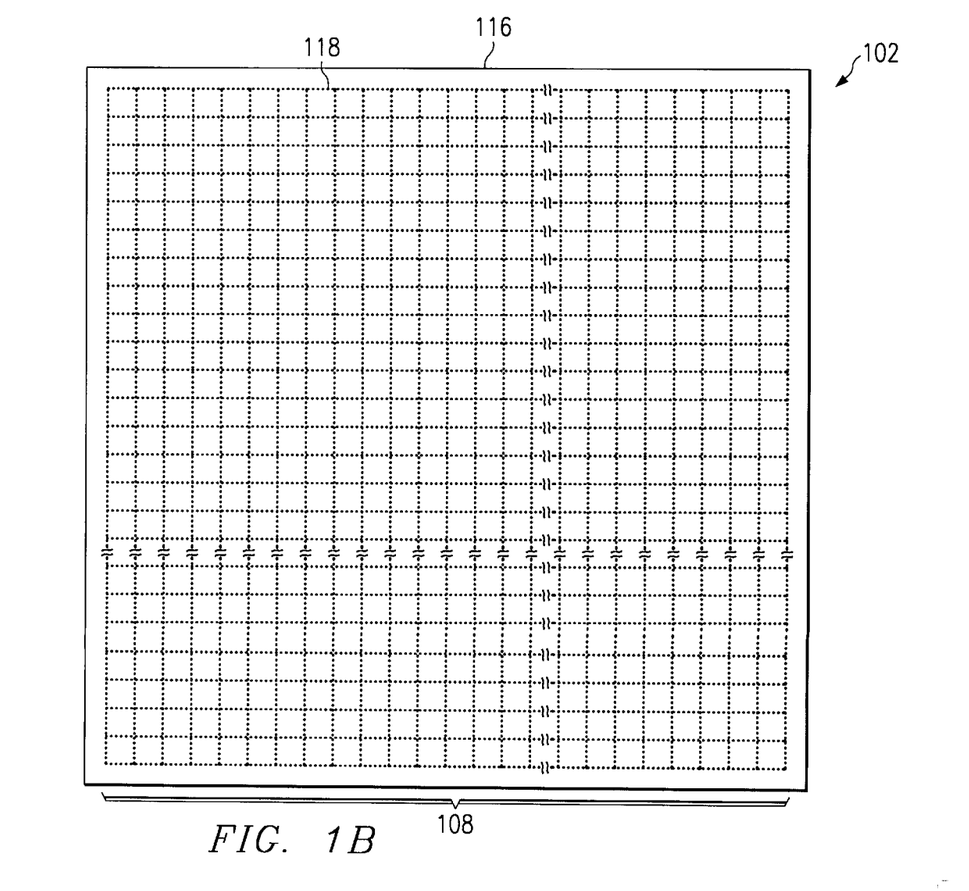

FIG. 1B is a pictorial representation of the "front" or active side of sensor circuit 102; that is, FIG. 1B depicts the major surface of the die 116 on which the active devices constituting sensor circuit 102 are formed. Sensor array 108 is located on the front side of die 116 and includes a plurality of cells 118, each containing one or more capacitive electrodes. Sensor array 108 in the exemplary embodiment contains square cells approximately 45–50 $\mu$m on a side, forming a 250×350 array of contiguous cells 118 within sensor array 108. Sensor array 108 is covered by a passivation material overlying the capacitive electrodes within each cell 118. Other active devices required to form sensor circuit 102 are formed below the capacitive electrodes. Buses from sensor circuit 102, including in particular the sensor output bus, is formed within a backside bus via, as described below.

Figure 1C:
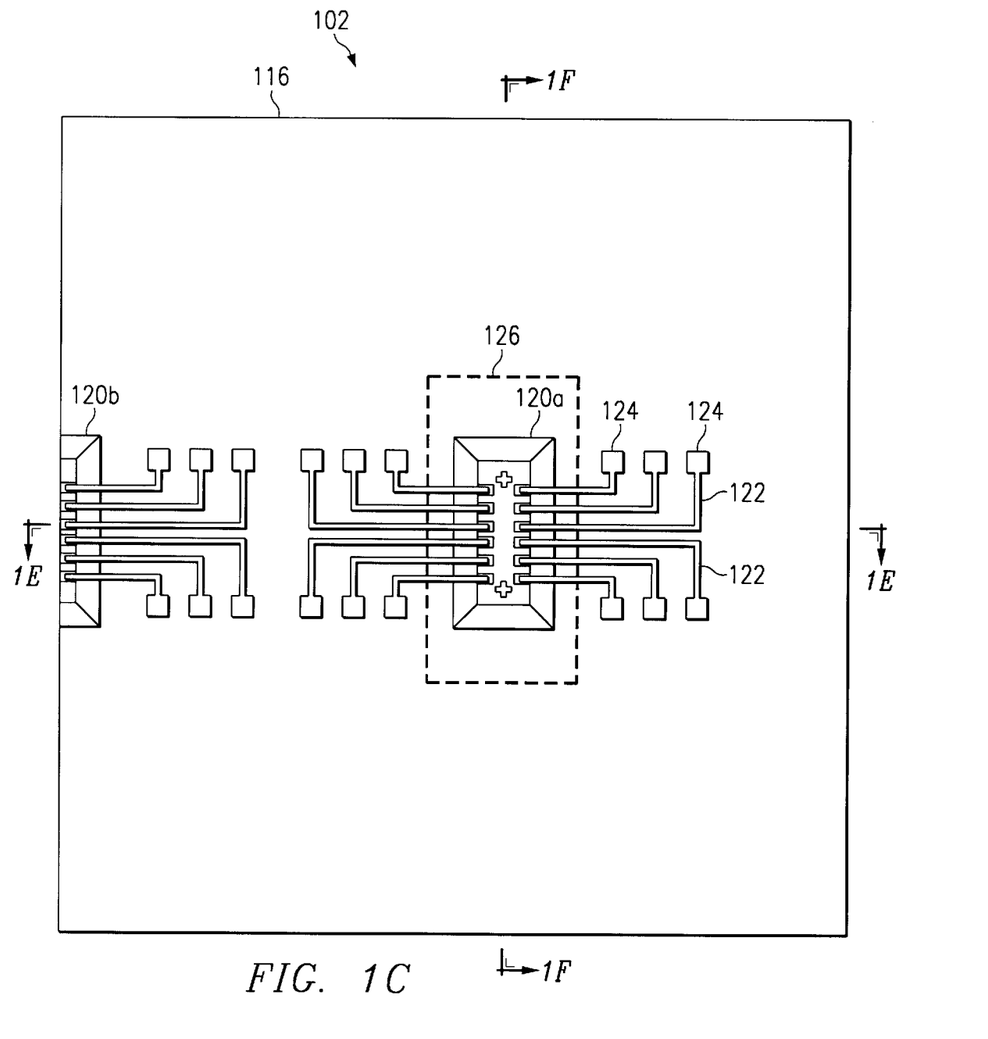

FIG. 1C is a pictorial representation of the backside of sensor circuit 102 formed on die 116. A backside contact bus via 120a, 120b is etched into the backside of die 116, either within the body of die 116 as illustrated by bus via 120a or along the die boundary as illustrated by bus via 120b. Interconnects 122 on the backside surface of die 116 and extending into bus via 120a, 120b connect bus tabs within an active layer on the active side of die 116 with contact pads 124 on the backside surface.

Figure 1D:
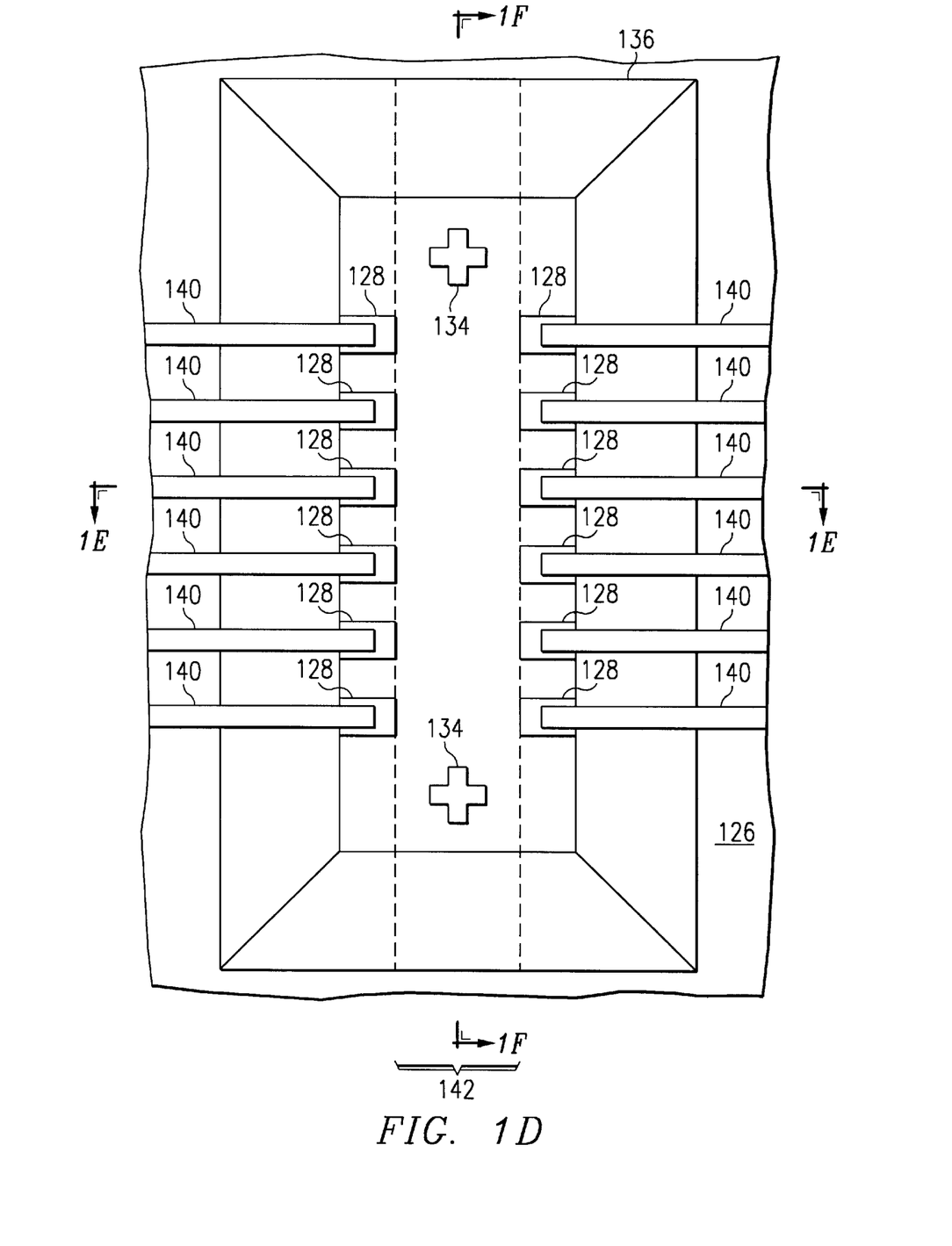
Figure 1E:
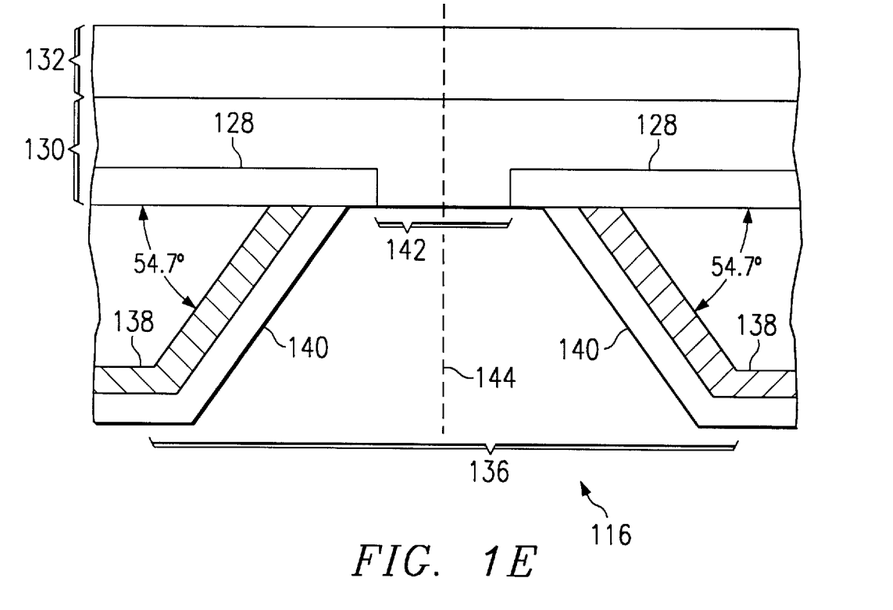
Figure 1F:
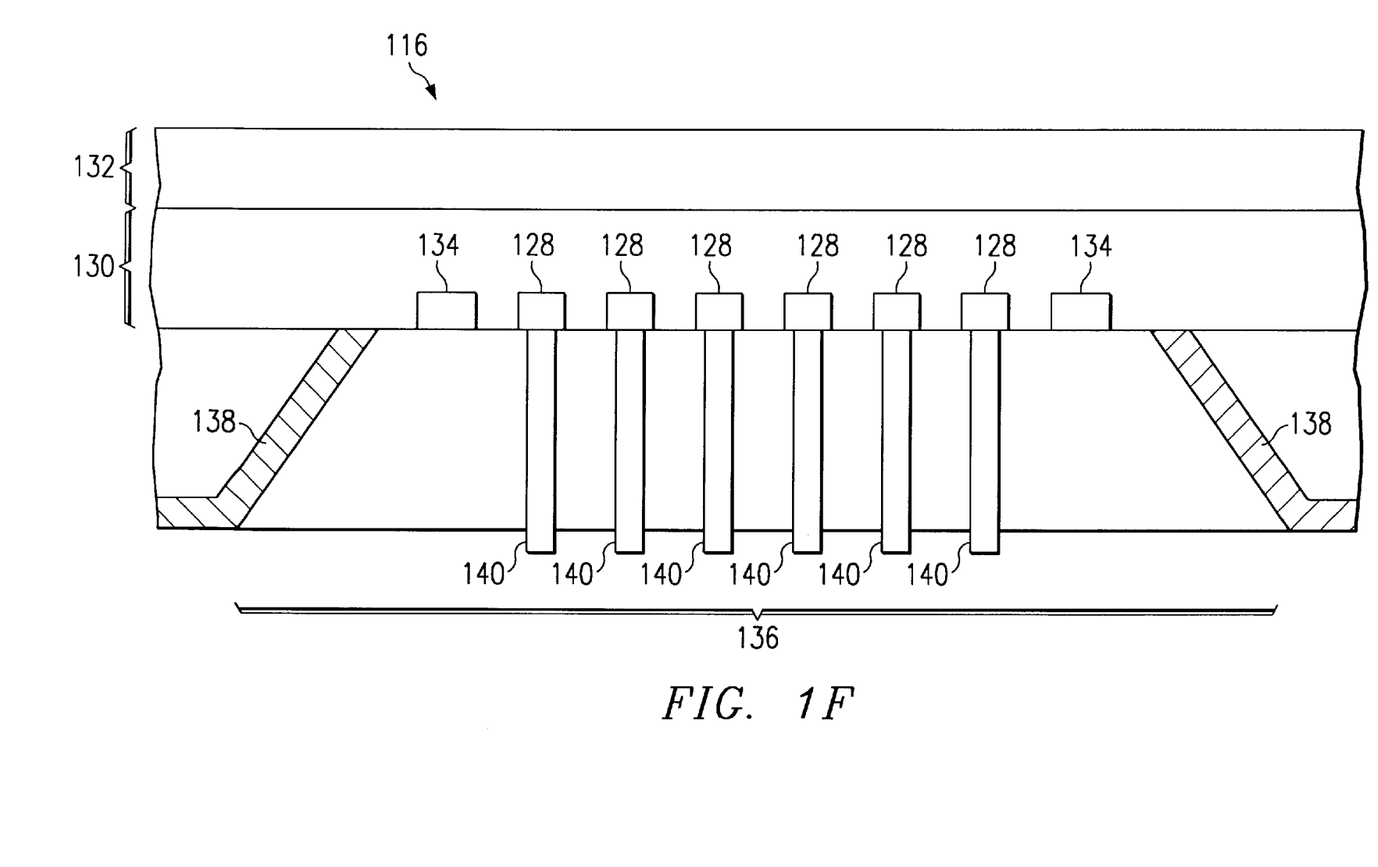
Figure 1G:
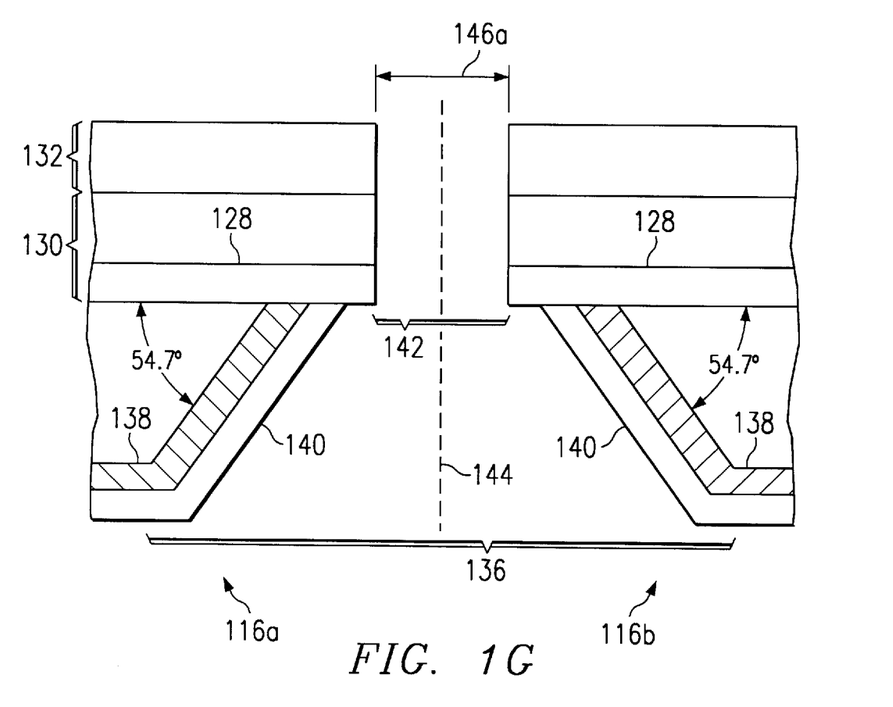
Figure 1H:
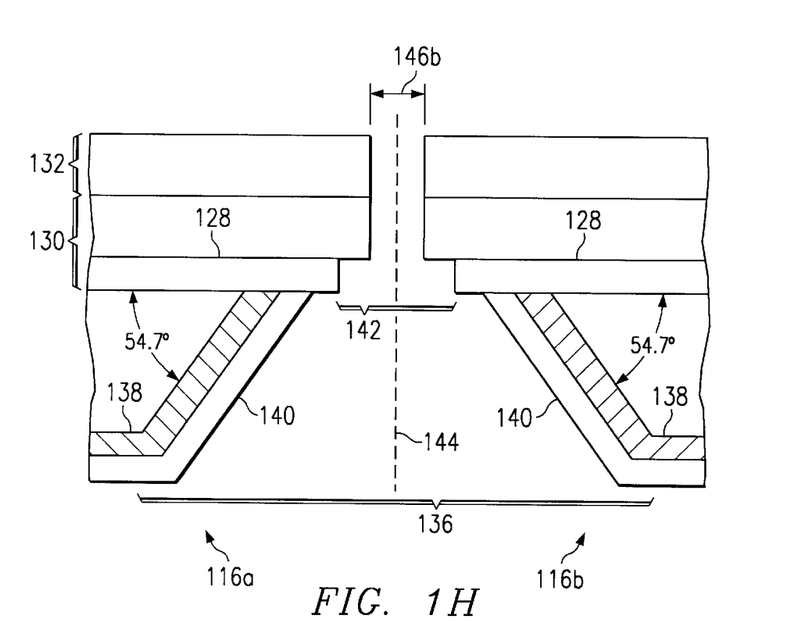

FIG. 1D depicts a detail of region 126 in FIG. 1C, and corresponds to either bus via 120a as shown or bus via 120b prior to separation of two adjacent die within a single substrate; FIG. 1E depicts a cross-sectional view of region 126 taken at section line A—A, which corresponds to a logical boundary between two adjacent die in the case of bus via 120b prior to separation of the two adjacent die 116; FIG. 1F depicts a cross-sectional view of region 126 taken at section line B—B; FIG. 1G depicts a cross-sectional view of region 126 taken at section line A—A following separation of two adjacent die by a device having a kerf equal to the width of the region between the rows of bus taps; and FIG. 1H depicts a cross-sectional view of region 126 taken at section line A—A following separation of two adjacent die by a device having a kerf less than the width of the region between the rows of bus taps. FIGS. 1D through 1H are intended to be taken together. In the present invention, bus taps 128 for each bus conductor to be routed to the backside surface of die 116 are formed within an active layer 130 on the active side of die 116. Those skilled in the are will recognize that active layer 130 may actually comprise several layers of metallization and intervening insulating material. Bus taps 128 may be formed in the first metallization level within active layer 130, but are preferably formed in a last metallization level within active layer 130, over which passivation material 132 is formed. Bus taps 128 preferably have a width of approximately 1.5 $\mu$m and are located adjacent to one another at a pitch of about 3 $\mu$m. Although the exemplary embodiment shows six bus taps 128 on each side, any suitable number of bus taps may be formed and utilized for routing a bus to the backside of die 116. Alignment marks 134 are formed at the same time, in the same metallization level, and from the same material as bus taps 128.

A slot 136 is then etched into the backside surface of die 116, exposing bus taps 128 and alignment marks 134. Slot 136 is etched with significantly sloped sidewalls, preferably using a potassium hydroxide (KOH) based wet etch on <100>silicon, which is known to remove the silicon along crystal planes, resulting in a tetrahedral opening having the shape of an inverted, four-sided pyramid with sidewalls at an angle of 54.7° with the major surface of the substrate. The size of the slot 136 at the bottom is determined by the blind backside alignment precision, and therefore must be large enough in both width and length to expose a sufficient amount of bus taps 128 for making a reliable connection, and to expose alignment marks 134. For the exemplary embodiment depicted, the width of slot 136 at the bottom should be 10 $\mu$m (5 $\mu$m for each row of bus taps 128) plus the distance between the rows of bus taps 128 plus the margin of error for blind backside alignment. The length of slot 136 at the bottom should be, for the example shown, the pitch between the alignment marks 134 plus the width of an alignment mark 134 plus the margin for error in blind backside alignment. If the alignment marks 134 are located between the rows of bus taps 128, slot 136 may be shortened, but may also need to be widened.

Figure 2:
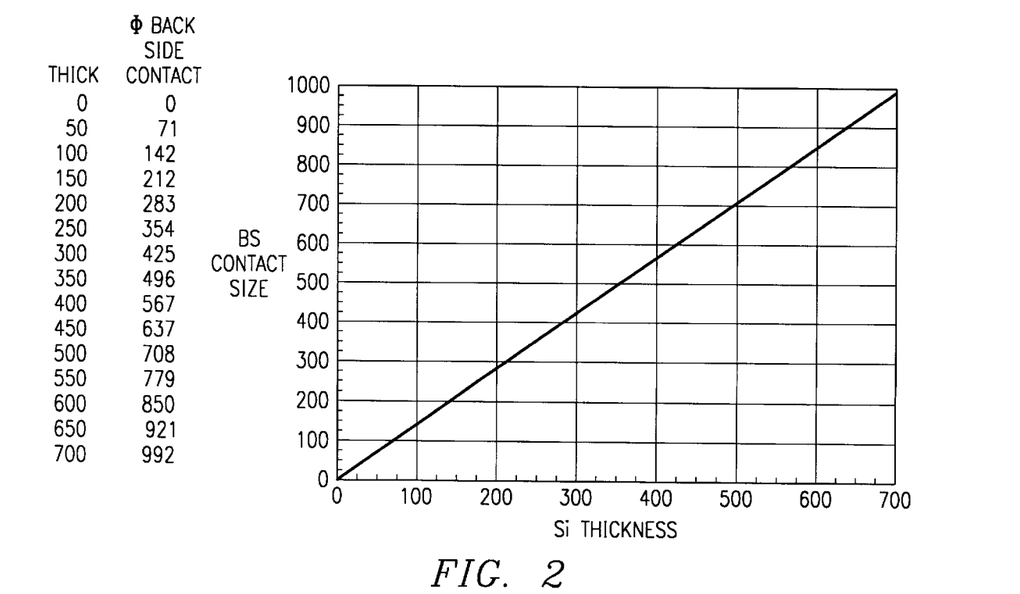
FIG. 2 is a graph of minimum required additional bus via slot width at the substrate surface as a function of slot depth in forming a bus via slot having sloped sidewalls in accordance with a preferred embodiment of the present invention.

Since the sidewalls of slot 136 are sloped at a deterministic angle, the size of slot 136 at the backside surface of die 116 may be determined from the size of slot 136 at the bottom. Given the required width or length, x, of slot 136 at the bottom, the corresponding width or length, x', at the backside surface may be determine from x'=x(2)(t)tan 54.7°, where t is the thickness of the silicon to be etched through, or the depth of the slot 136. FIG. 2 shows a graph of the additional width required on one side of an opening as a function of the thickness of silicon etched.

After etching slot 136, an insulating layer 138 is formed on the backside surface of die 116 and on the sidewalls of slot 136, leaving at least portions of bus taps 128 exposed.

Insulating layer 138 may be formed by depositing a dielectric material such as silicon dioxide ($SiO_2$) uniformly over the backside of die 116 by chemical vapor deposition (CVD) or plasma-enhanced chemical vapor deposition (PECVD), then patterning and etching the dielectric material to expose portions of bus taps 128. Alternatively, insulating layer 138 may be selectively grown silicon dioxide formed only on the backside surface of die 116 and on the sidewalls of slot 136.

Interconnects 140 are then formed over insulating layer 138 on the sidewalls of slot 136 and on the backside surface of die 116, each interconnect 140 electrically connecting a bus tap 128 with a backside contact pad on the backside surface of the die 116. Interconnects 140 should be no wider than bus taps 128 and should be spaced at the same pitch as bus taps 128.

As noted above, slot 136 maybe etched anywhere on the backside surface of die 116, including near the center or along the die boundary. A shared backside bus via may be formed by etching slot 136 across a die boundary 144, exposing bus taps on both die adjacent to the boundary 144. After formation of the interconnects 140 between the bus taps 128 and the backside die contacts, the die may be separated along the boundary 144, with the separation mechanism (e.g., saw) consuming all or any part of the region 142 between the rows of bus taps 128. FIG. 1G depicts a cross-sectional view of region 126 in the case of bus via 120*b* depicted in FIG. 1C, taken at section line A—A following separation of two adjacent die 116*a* and 116*b* by a device having a kerf 146*a* equal to the width of the region 142 between the rows of bus taps 128. FIG. 1H depicts a cross-sectional view of region 126 in the case of bus via 120*b* depicted in FIG. 1C, taken at section line A—A following separation of two adjacent die 116*a* and 116*b* by a device having a kerf 146*b* less than the width of the region between the rows of bus taps. After separation, the row of bus taps 128 on one side of slot 136 and the corresponding interconnects 140 will form a backside bus for one die 116*a*, while the other row of bus taps 128 and corresponding interconnects 140 form a backside bus for the other die 116*b*.

Figure 3A:
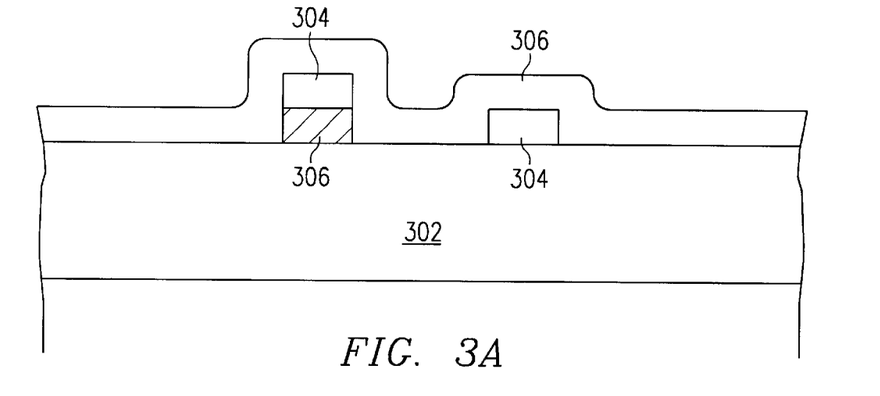
FIGS. 3A–3G depict a series of cross-sections for fabrication of a backside bus in accordance with a preferred embodiment of the present invention.

With reference now to FIGS. 3A through 3G, a series of cross-sections for fabrication of a backside bus in accordance with a preferred embodiment of the present invention are depicted. The process begins, as depicted in FIG. 3A, with a substrate 302 on which metal bus taps 304 are formed within active layers on a active side of the substrate over what will be the backside bus area. The view depicted is a cross-section along a row of bus taps, looking into the ends of the bus taps, with the active side of the substrate at the top. Bus taps 304 may be formed in the first metallization layer directly on substrate 302, or in an upper metallization layer separated from substrate 302 by dielectric (e.g., oxide) 306. Alignment marks may be formed at the same level as metal taps 304 for use in subsequent alignment between active and backside masks. A passivation layer 308 overlies bus taps 304.

Figure 3B:
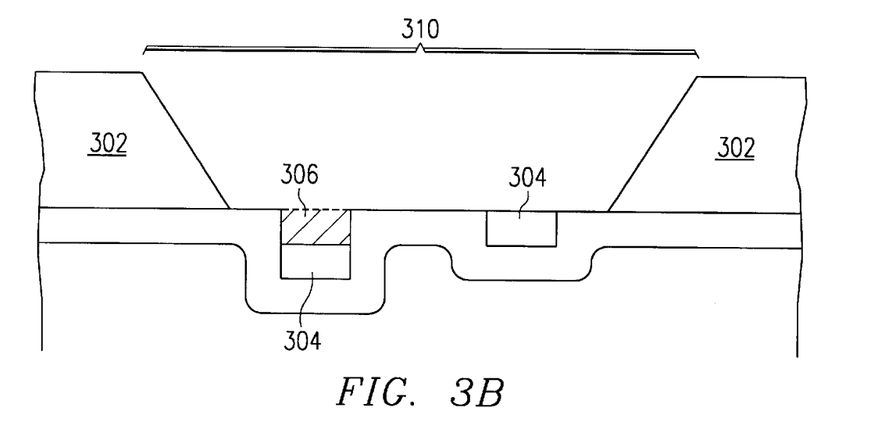

In FIG. 3B, the cross-section view has been inverted, with the backside of substrate 302 at the top, to indicate that processing is performed on the backside of substrate 302. An slot 310 is etched through substrate 302, exposing metal taps 304, utilizing a KOH-based etch to form an opening having sloped sidewalls. An oxide or nitride hard mask (not shown) may be utilized to etch slot 310, and passivation layer 308 may be employed as an etch stop. In any embodiment, the dielectric overlying metal tabs 304 is preferably selectively etchable with respect to materials underlying the metal tabs 304, so that the dielectric may be utilized as an etch stop.

Slot 310 is blind etched into the backside of substrate 302, with alignment, for example, only to the wafer flat(s) and not to die features. The precision of the blind backside slot etch determines the design rules for metal tabs 304. Dielectric 306 may also be etched through, to allow direct contact with upper metallization levels without vias. Such direct contact with upper metallization levels is useful, for instance, in grounding for electrostatic discharge (ESD) protection in capacitive sensor circuits of the type described above.

Figure 3C:
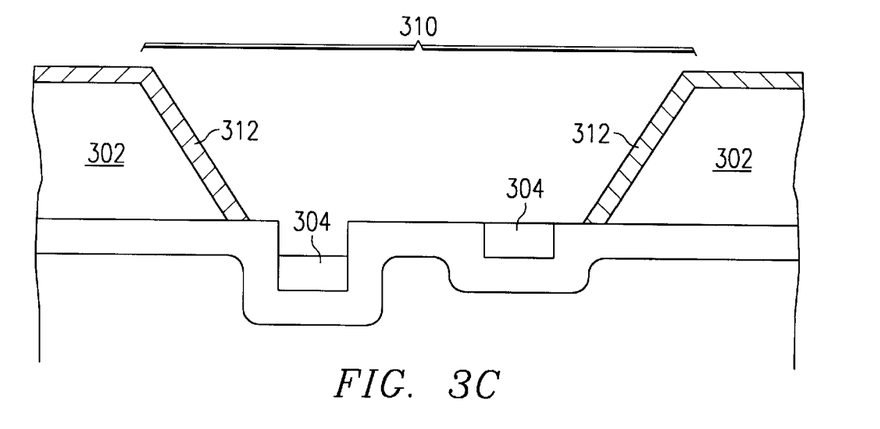
Figure 3D:
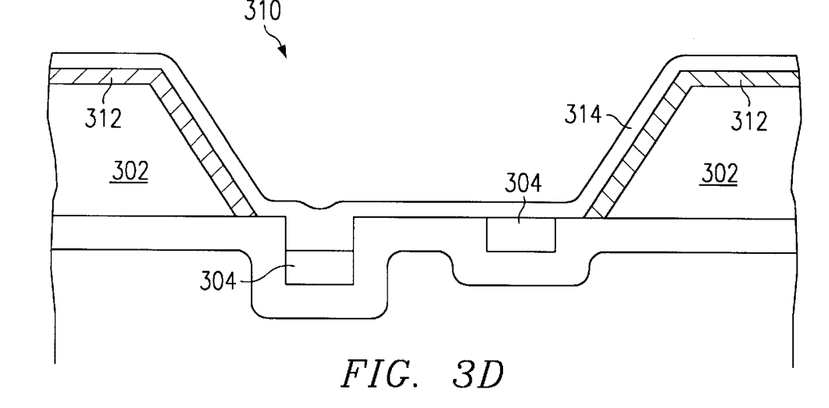
Figure 3E:
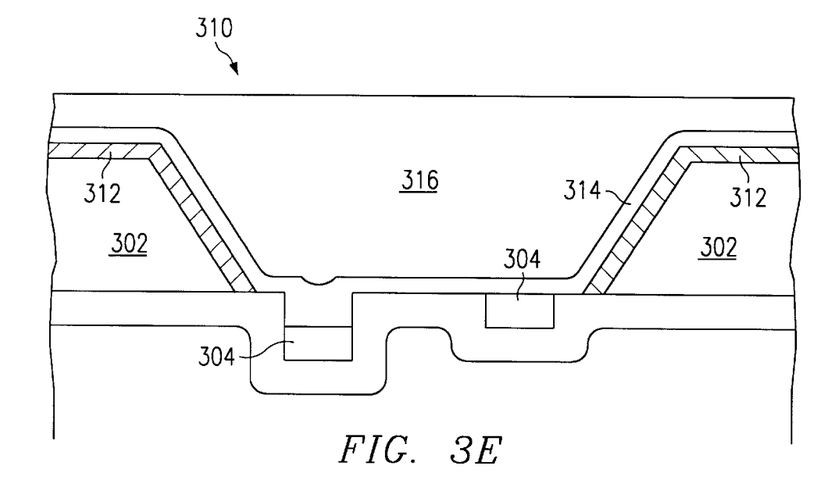

An insulating layer 312 is then formed on the backside surface of substrate 302 and on the sloped sidewalls of opening 310 as depicted in FIG. 3C. At least some portion of metal tabs 304 is left exposed. A layer of metal 314, such as aluminum, is then formed over the backside of substrate 302, overlying insulating layer 312 and the bottom of slot 310, as shown in FIG. 3D. A blind etch may be required through metal layer 314 and/or insulating layer 312 to expose alignment marks, if any, previous formed the same metallization layer(s) as tabs 304 on the active side. Next, a thick polyimide layer 316 is formed as depicted in FIG. 3E, filling slot 310 and planarizing the backside surface of substrate 302 to keep within the depth of focus of steppers employed to pattern metal layer 314.

Figure 3F:
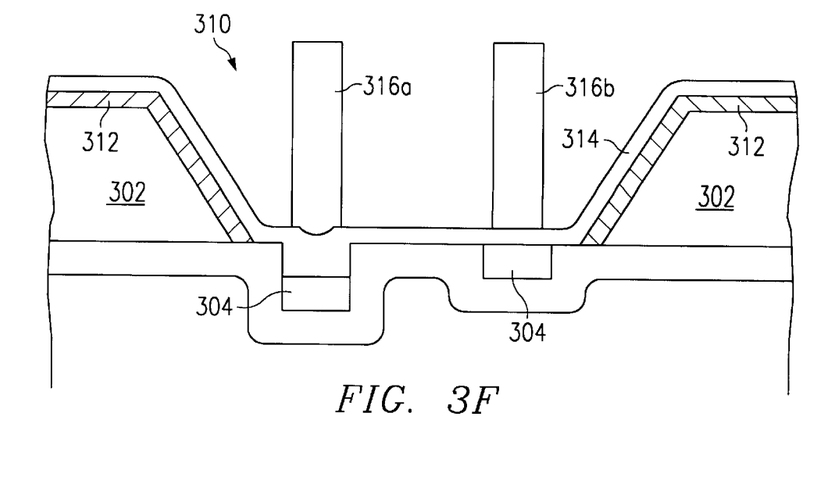

Polyimide layer 316 is then patterned and etched to be utilized as a hard mask for the metal etch, as shown in FIG. 3F. Polyimide regions 316*a*, 316*b* are left where interconnects or contact pads are desired. Alignment precision of backside metallization pattern with the active side pattern will determine design rules for metal tabs 304. However, if alignment marks may be left on the active side, in the same metallization level at metal tabs 304, front-to-back alignment of metallization patterns will not be blind, and therefore alignment errors in the backside metallization pattern may be expected to be much smaller than alignment errors in the blind backside slot etch. With alignment marks, alignment precision of the backside metallization pattern may be expected to be as small as 2 μm.

Figure 3G:
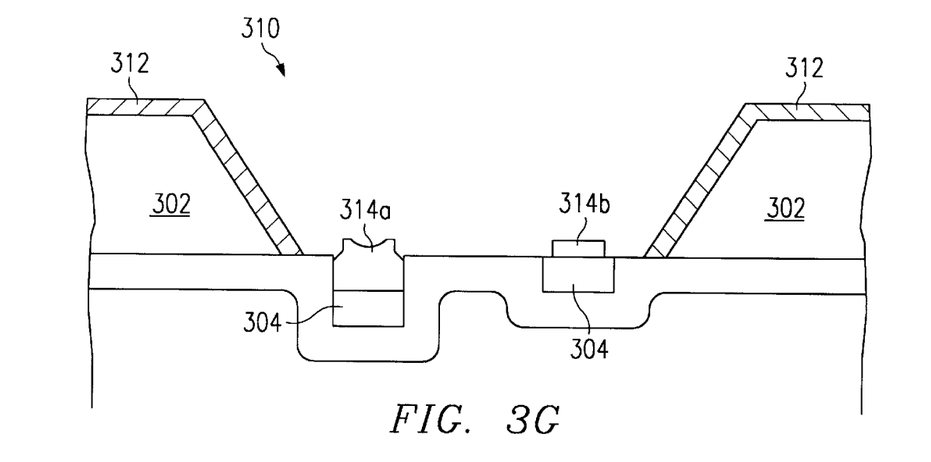

Metal layer 314 is then etched as depicted in FIG. 3G, masked by polyimide regions 316*a* and 316*b*, leaving metal interconnects 314*a* and 314*b* in contact with metal tabs 304 and extending up the sidewalls of slot 310 and onto the backside surface of substrate 302. A metal etch capable of etching on the sloping sidewalls of slot 310 is needed, and will therefore preferably comprise a wet chemical etch suitable for the metal employed for metal layer 314. Such suitable etches for aluminum are known in the art. Backside contact pads connected to interconnects 314*a* and 314*b* may be formed from metal layer 314 in the same step. A passivation material (not shown) is then formed over the backside surface of substrate 302, and backside pads are patterned, if necessary, as are pad openings to the backside contact pads.

Figure 4A:
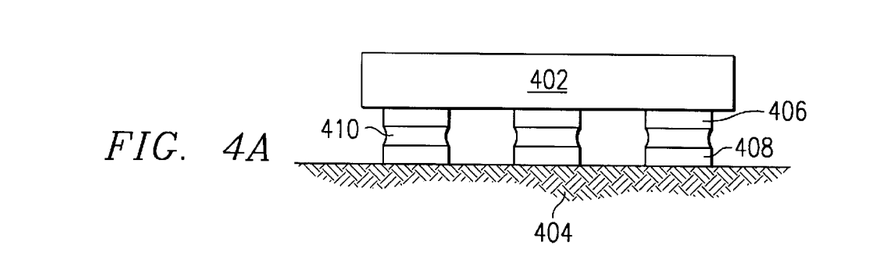
FIGS. 4A–4B are illustrations of various applications of the backside bus in accordance with a preferred embodiment of the present invention.
Figure 4B:
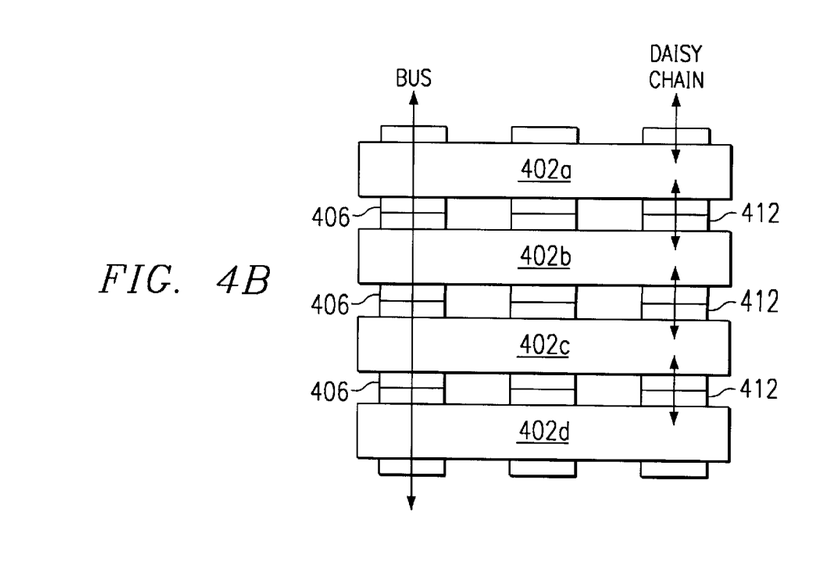

Referring to FIGS. 4A and 4B, various applications of the backside bus in accordance with a preferred embodiment of the present invention are illustrated. As illustrated in FIG. 4A, a die 402 including a backside bus in accordance with the present invention may be directly mounted within a package 404. During packaging, backside bus contact pad 406 are electrically connected with a contact region 408 on the package 404, where the contact regions 408 on package 404 is electrically connected to a pin or to other circuitry. Package 404 may be any type of package suitable for use with integrated circuits, including a printed circuit board (PCB) package with a ball grid array (BGA) of contacts connected to pins, a lead-frame encapsulated in a plastic resin, or a credit card-type package. Direct contact between backside bus contact pads 406 and contact regions 408 may be employed, or electrical contact may be facilitated by a material 410 such as conductive epoxy, solder, or the like. A resin (not shown) may be employed to hold the integrated circuit die 402 on package 404. Direct mounted of the type shown is especially useful for sensor circuits—including imaging sensors, state switches, and chemical sensors—in which the sensor is located on the active side of the die 402.

FIG. 4B illustrates use of die including a backside bus in accordance with the present invention to form stackable integrated circuits. Die 402a–402d including a backside bus with backside contact pads 406 also include active side pads 412 to the bus conductors, formed in accordance with the known art. Die 402a–402d are then stacked with the backside contact pad 406 for a bus conductor on one die 402a electrically connected to a active side contact pad 412 for the same bus conductor on a second die 402b. An arbitrary member of die may be stacked in this manner, and, depending on the connections to the contact pads within each die, may form a single bus through the backside and active side contact pads 406 and 412 or, alternatively, may formed daisy-chained integrated circuits (that is, a signal gets processed in each integrated circuit before being passed to the next integrated circuit in the chain). This feature may be utilized for stackable memory blocks, stackable image processing layers, or the like.

The present invention employs a slot etched from the backside of a substrate through which multiple bus connectors are routed rather than a single hole per conductor as in the case of conventional backside vias. The slot has sloped sidewalls allowing metal to be deposited and patterned from the backside to connect the bus to the backside. Since the metal is patterned, the area required per connector may be much smaller (Å$^2$/mm$^2$) than utilizing a backside hole for each connector, requiring as little as 20% of the space for the same number of connectors. A much smaller typical pad (100×100 $\mu$m), may be utilized, which is great for pad-limited designs. Since many signals can be passed through a single slot, the total cross-section of etched silicon can be much smaller, leading to better mechanical support for circuits requiring large buses. Implementation of the present invention adds only one low precision mask step and one high precision mask step to the fabrication process, and may avoid the need for patterning a via to the top metallization layer for some designs.

While the invention has been particularly shown and described with reference to a preferred embodiment, it will be understood by those skilled in the art that various changes in form and detail may be made therein without departing from the spirit and scope of the invention.

What is claimed is:

1. An integrated circuit structure, comprising:
   a substrate having an active layer including a plurality of bus taps within a metallization level within the active layer;
   a slot in a backside surface of the substrate exposing the bus taps; and
   a plurality of interconnects in the slot, each interconnect electrically connecting a single bus tap within the plurality of bus taps to a contact pad within a plurality of contact pads on the backside surface of the substrate.

2. The integrated circuit structure of claim 1, wherein the plurality of bus taps are within a first metallization level within the active layer.

3. The integrated circuit structure of claim 1, wherein the plurality of bus taps include a first set of bus taps on a first side of a logical boundary between two integrated circuit die and a second set of bus taps on a second side of the logical boundary.

4. The integrated circuit structure of claim 1, wherein the slot has sidewalls sloped at an angle of 54.7°.

5. The integrated circuit structure of claim 4, wherein the slot is formed using a KOH based etch in <100>silicon.

6. The integrated circuit structure of claim 1, wherein the slot has a width at a bottom of the slot exceeding a kerf of a device employed to separate two die including the slot plus twice a required contact area.

7. The integrated circuit structure of claim 1, wherein the slot has portions on both sides of a logical boundary between two integrated circuit die.

8. The integrated circuit structure of claim 1, further comprising:
   a dielectric on sidewalls in the slot and on the backside surface of the substrate between the substrate and the plurality of interconnects and between the substrate and the plurality of backside contact pads.

9. The integrated circuit structure of claim 1, wherein the plurality of bus taps are connects to a first integrated circuit within a first die and a second integrated circuit within a second die.

10. The integrated circuit structure of claim 1, wherein the plurality of bus taps include first and second sets of bus taps on opposite sides of the slot, wherein the first set of bus taps is connected to a first integrated circuit within a first die and the second set of bus taps is connected to a second integrated circuit within a second die.

11. A circuit structure, comprising:
   a substrate die containing an integrated circuit within an active layer including a plurality of bus taps, the plurality of bus taps within a metallization level within the active layer and connected to the integrated circuit;
   a slot in a backside surface and along an edge of the substrate die, wherein portions of the bus taps are exposed at a bottom of the slot; and
   a plurality of interconnects in the slot and on the backside surface, each interconnect connecting a single bus tap within the plurality of bus taps to a contact pad within a plurality of contact pads on the backside surface of the substrate die.

12. The circuit structure of claim 11, wherein the plurality of bus taps extend to the edge of the substrate die.

13. The circuit structure of claim 11, wherein the plurality of bus taps extend into the slot but not to the edge of the substrate die.

14. The circuit structure of claim 11, wherein the slot has sidewalls sloped at an angle of 54.7°.

15. The circuit structure of claim 11, wherein the substrate die comprises a first substrate die and the integrated circuit comprises a first integrated circuit, the circuit structure further comprising:

a second substrate die containing a second integrated circuit stacked with the substrate die, wherein the plurality of backside contact pads on the first substrate die are electrically connected to contacts on the second substrate die which are connected to the second integrated circuit.

16. The circuit structure of claim 15, wherein the connection between the plurality of backside contact pads on the first substrate die and the contacts on the second substrate die form a bus.

17. The circuit structure of claim 15, wherein the connection between the plurality of backside contact pads on the first substrate die and the contacts on the second substrate die daisy chain the first and second integrated circuits.

18. An integrated circuit structure, comprising:

a substrate including first and second die separated by a logical boundary, each die containing an integrated circuit within an active layer and including a plurality of bus taps within a metallization level for the active layer which are connected to the integrated circuit;

a slot in a backside surface along the logical boundary, wherein portions of the bus taps are exposed at a bottom of the slot; and a plurality of interconnects in the slot and on the backside surface, each interconnect connecting a single bus tap within the plurality of bus taps to a contact pad within a plurality of contact pads on the backside surface of the substrate.

19. The integrated circuit structure of claim 18, wherein the slot has sidewalls sloped at an angle formed using a KOH based etch in <100>silicon.

20. The integrated circuit structure of claim 18, wherein the slot has a width at a bottom of the slot exceeding a kerf of a device employed to separate the first and second die plus twice a required contact area.

* * * * *